(12) United States Patent
Mehandru et al.

(10) Patent No.: US 10,770,458 B2
(45) Date of Patent: Sep. 8, 2020

(54) NANOWIRE TRANSISTOR DEVICE ARCHITECTURES

(71) Applicant: INTEL CORPORATION, Santa Clara, CA (US)

(72) Inventors: Rishabh Mehandru, Portland, OR (US); Tahir Ghani, Portland, OR (US); Szuya S. Liao, Portland, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 106 days.

(21) Appl. No.: 15/754,709

(22) PCT Filed: Sep. 25, 2015

(86) PCT No.: PCT/US2015/052305
§ 371 (c)(1),
(2) Date: Feb. 23, 2018

(87) PCT Pub. No.: WO2017/052611
PCT Pub. Date: Mar. 30, 2017

(65) Prior Publication Data
US 2019/0279978 A1 Sep. 12, 2019

(51) Int. Cl.
*H01L 29/423* (2006.01)
*H01L 27/088* (2006.01)
(Continued)

(52) U.S. Cl.
CPC .......... *H01L 27/0886* (2013.01); *B82Y 10/00* (2013.01); *B82Y 40/00* (2013.01);
(Continued)

(58) Field of Classification Search
CPC ............... H01L 21/02518; H01L 21/64; H01L 21/8232; H01L 29/66409
See application file for complete search history.

(56) References Cited

U.S. PATENT DOCUMENTS 8,823,059 B2 9/2014 Dewey et al.
2014/0051213 A1 2/2014 Chang et al.
(Continued)

FOREIGN PATENT DOCUMENTS

WO 2015000205 A1 1/2015
WO 2017/052611 A1 3/2017

OTHER PUBLICATIONS

International Search Report and Written Opinion received for PCT Application No. PCT/US2015/052305, dated Jun. 15, 2016. 14 pages.
(Continued)

*Primary Examiner* — Cheung Lee
(74) *Attorney, Agent, or Firm* — Finch & Maloney PLLC

(57) ABSTRACT

Techniques are disclosed for forming nanowire transistor architectures in which the presence of gate material between neighboring nanowires is eliminated or otherwise reduced. In some examples, neighboring nanowires can be formed sufficiently proximate one another such that their respective gate dielectric layers are either: (1) just in contact with one another (e.g., are contiguous); or (2) merged with one another to provide a single, continuous dielectric layer shared by the neighboring nanowires. In some cases, a given gate dielectric layer may be of a multi-layer configuration, having two or more constituent dielectric layers. Thus, in some examples, the gate dielectric layers of neighboring nanowires may be formed such that one or more constituent dielectric layers are either: (1) just in contact with one another (e.g., are contiguous); or (2) merged with one another to provide a single, continuous constituent dielectric layer shared by the neighboring nanowires.

20 Claims, 4 Drawing Sheets

(51) Int. Cl.

| | |
|---|---|
| *H01L 21/8234* | (2006.01) |
| *H01L 29/06* | (2006.01) |
| *H01L 29/51* | (2006.01) |
| *H01L 29/775* | (2006.01) |
| *H01L 29/78* | (2006.01) |
| *B82Y 10/00* | (2011.01) |
| *H01L 29/786* | (2006.01) |
| *B82Y 40/00* | (2011.01) |

(52) U.S. Cl.
CPC ........... *H01L 21/823412* (2013.01); *H01L 21/823431* (2013.01); *H01L 21/823437* (2013.01); *H01L 29/0673* (2013.01); *H01L 29/42364* (2013.01); *H01L 29/42392* (2013.01); *H01L 29/511* (2013.01); *H01L 29/517* (2013.01); *H01L 29/775* (2013.01); *H01L 29/78* (2013.01); *H01L 29/785* (2013.01); *H01L 29/78696* (2013.01); *H01L 2029/42388* (2013.01)

(56) References Cited

U.S. PATENT DOCUMENTS

| | | |
|---|---|---|
| 2015/0053928 A1 | 2/2015 | Ching et al. |
| 2015/0104918 A1 | 4/2015 | Liu et al. |
| 2015/0243508 A1 | 8/2015 | Romero et al. |
| 2015/0270340 A1 | 9/2015 | Frank et al. |

OTHER PUBLICATIONS

International Preliminary Report on Patentability received for PCT Application No. PCT/US2015/052305, dated Apr. 5, 2018. 11 pages.

Extended European Search Report received for EP Application No. 15904945.1, dated Apr. 8, 2019. 8 pages.

TW Office Action and Search Report dated Dec. 30, 2019, issued by the Intellectual Property Office (the IPO). 11 pages. English translation not available.

TW Office Action and Search Report dated Dec. 30, 2019, issued by the intellectual Property Office (the IPO). English Translation. 7 pages.

NANOWIRE TRANSISTOR DEVICE ARCHITECTURES

BACKGROUND

In typical nanowire transistor architectures, each conducting channel is provided by a silicon nanowire that is fully wrapped (e.g., on all sides) with a three-dimensional metal gate in a so-called gate-all-around (GAA) configuration. Source/drain contacts are normally electrically coupled with the ends of each channel, on either side of the gate.

Figure 1A:
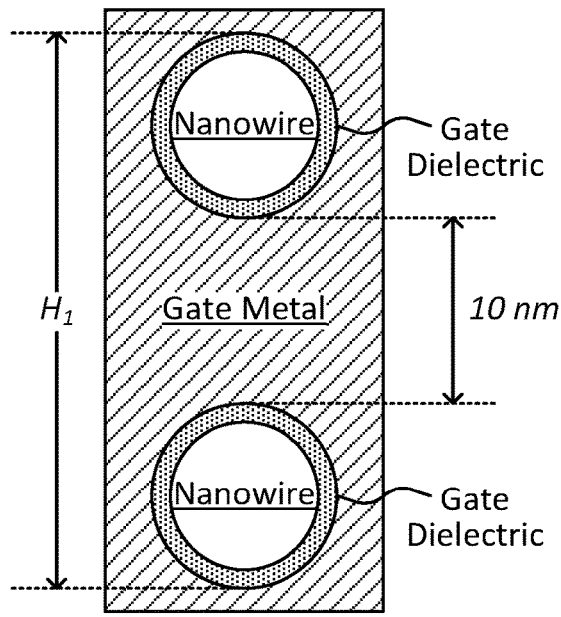
FIG. 1A illustrates a cross-sectional view of an example nanowire transistor architecture.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topography or otherwise be non-smooth, given real-world limitations of fabrication processes. In short, the figures are provided merely to show example structures.

DETAILED DESCRIPTION

Techniques are disclosed for forming nanowire transistor architectures in which the presence of gate material between neighboring nanowires is eliminated or otherwise reduced. In accordance with some embodiments, neighboring nanowires can be formed sufficiently proximate one another such that their respective gate dielectric layers are either: (1) just in contact with one another (e.g., are contiguous); or (2) merged with one another to provide a single, continuous dielectric layer shared by the neighboring nanowires. In some cases, the gate dielectric layer associated with a given nanowire may be of a multi-layer configuration, having two or more constituent dielectric layers. Thus, in accordance with some embodiments, the gate dielectric layers of neighboring nanowires may be formed such that one or more constituent dielectric layers are either: (1) just in contact with one another (e.g., are contiguous); or (2) merged with one another to provide a single, continuous constituent dielectric layer shared by the neighboring nanowires. Numerous configurations and variations will be apparent in light of this disclosure.

General Overview

Figure 1B:
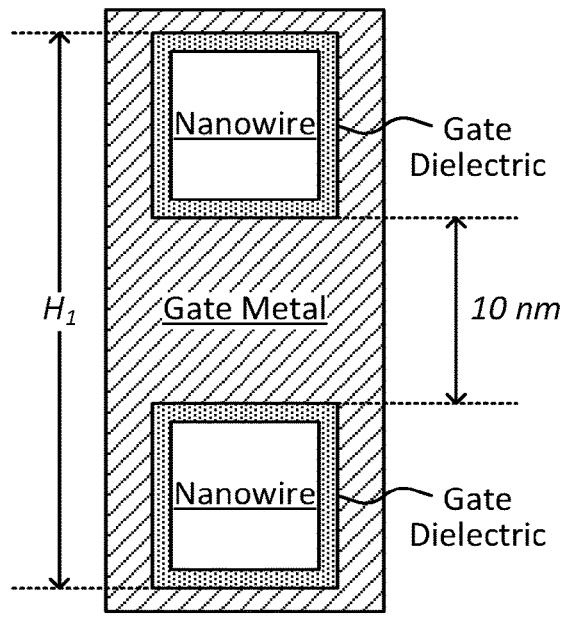
FIG. 1B illustrates a cross-sectional view of another example nanowire transistor architecture.

Existing nanowire transistor architectures are normally constructed with a large amount of gate metal between the constituent nanowires. For instance, consider FIGS. 1A-1B, which illustrate cross-sectional views of several example nanowire transistor architectures. As can be seen, the neighboring nanowires of FIGS. 1A and 1B are separated by 10 nm of gate metal. That gate metal is separated from active doped source/drain semiconductor regions or source/drain metal by only a thin gate dielectric layer. Consequently, the presence of that gate metal contributes to very large parasitic capacitance, degrading power consumption and switching delay time of the nanowire transistor architecture. Even if a spacer were formed between neighboring nanowires, the parasitic capacitance between the gate metal and source/drain semiconductor region or source/drain metal would remain substantial. With respect to FIG. 1B, for example, if the rectangular nanowires in that architecture were brought any closer to one another, there would be extreme metal confinement for the top and bottom interfaces of each nanowire, and the work function metal in the region between those nanowires would not provide for complete turn-on of those nanowires.

Thus, and in accordance with some embodiments of the present disclosure, techniques are disclosed for forming nanowire transistor architectures in which the presence of gate material between neighboring nanowires is eliminated or otherwise reduced. In accordance with some embodiments, neighboring nanowires can be formed sufficiently proximate one another such that their respective gate dielectric layers are either: (1) just in contact with one another (e.g., are contiguous); or (2) merged with one another to provide a single, continuous dielectric layer shared by the neighboring nanowires. In some cases, the gate dielectric layer associated with a given nanowire may be of a multi-layer configuration, having two or more constituent dielectric layers. Thus, in accordance with some embodiments, the gate dielectric layers of neighboring nanowires may be formed such that one or more constituent dielectric layers are either: (1) just in contact with one another (e.g., are contiguous); or (2) merged with one another to provide a single, continuous constituent dielectric layer shared by the neighboring nanowires. As will be appreciated in light of this disclosure, the disclosed techniques can be used to provide a wide range of transistor devices and other integrated circuit structures including any of a wide range of combinations and permutations of dielectric layers (e.g., single-layer, multi-layer, or both). Mixing and matching of dielectric layers of single-layer configurations and multi-layer configurations (e.g., having any quantity of constituent layers) may be provided, with any desired combinations and permutations of continuity (e.g., merging) and contiguity (e.g., contact) there between, in accordance with some embodiments.

In some cases, use of the disclosed techniques may realize, in accordance with some embodiments, a reduction in parasitic capacitance contributed by the gate material while retaining sufficient gate control for the nanowires. By forming nanowires proximate one another (e.g., in a sort of "beads-on-a-string" configuration) using the disclosed techniques, the presence of gate material between neighboring nanowires may be eliminated or otherwise reduced, in accordance with some embodiments. As a result, the parasitic capacitance of the gate material and nearby source/drain regions may be minimized or otherwise reduced, in some cases with no or otherwise minimal loss of gate control of the nanowires, given the close proximity of the gate material that partially surrounds, but is not disposed between, neighboring nanowires. In some instances, nanowire rounding also may contribute to provision of sufficient gate control in the body of the nanowires. As will be appreciated in light of this disclosure, in some cases, the proximity to relatively thick gate material may ensure sufficient short-channel effects along with metal work function, providing for a capacitance reduction with minimal or otherwise negligible short-channel effect penalty.

As will be appreciated in light of this disclosure, the disclosed techniques can be used, for example, in providing vertical nanowire transistor devices (e.g., nanowire transistor architectures in which the constituent nanowires are oriented substantially perpendicular to the plane of an underlying substrate), as well as horizontal nanowire transistor devices (e.g., nanowire transistor architectures in which the constituent nanowires are oriented substantially parallel to the plane of an underlying substrate), in accordance with some embodiments. As will be further appreciated, the disclosed techniques can be utilized, for instance, in forming p-type metal-oxide-semiconductor (PMOS) devices, as well as n-type metal-oxide-semiconductor (NMOS) devices. In some instances, the disclosed techniques can be used, in accordance with some embodiments, to shrink gate lengths of complementary metal-oxide-semiconductor (CMOS) transistors for sub-20 nm gate length applications. Numerous suitable uses and applications will be apparent in light of this disclosure.

In accordance with some embodiments, a CMOS transistor architecture configured as described herein may exhibit any one, or combination, of reduced overall power-consumption and reduced switching time delay, as compared with traditional nanowire transistors. In accordance with some embodiments, integrated circuits (ICs) and other computer architectures implementing nanowire transistor devices configured as described herein may exhibit improvements, for example, in performance per watt ratings, as compared with ICs and computer architectures implementing only traditional nanowire transistors. Use of the disclosed techniques may be detected, for example, by visual or other inspection (e.g., such as by cross-sectional transmission electron microscopy image, or TEM) of a given transistor architecture (or other IC) having neighboring semiconductor nanowires configured with gate dielectric layers that touch or otherwise merge as variously described herein, in accordance with some embodiments.

Structure and Operation

Figure 2:
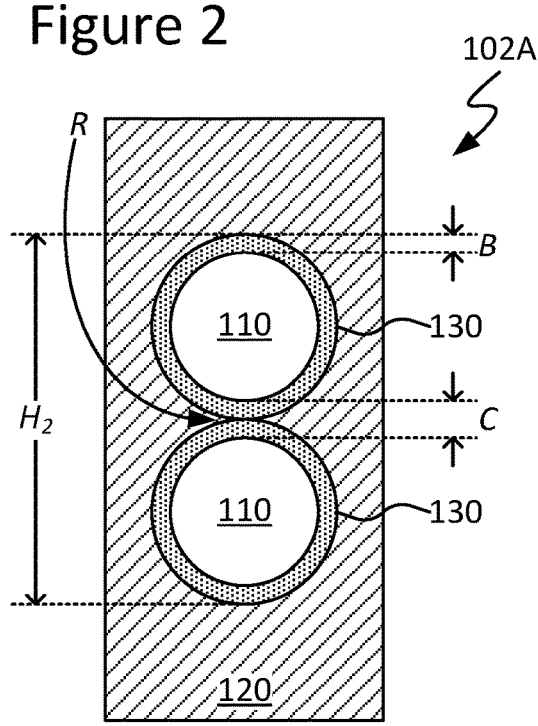
FIG. 2 illustrates a cross-sectional view of a nanowire transistor device configured in accordance with an embodiment of the present disclosure.
Figure 3:
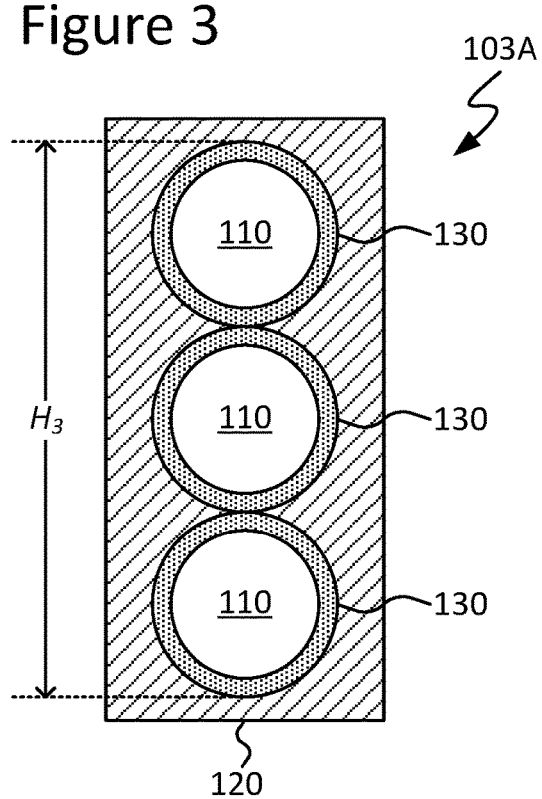
FIG. 3 illustrates a cross-sectional view of a nanowire transistor device configured in accordance with another embodiment of the present disclosure.
Figure 4:
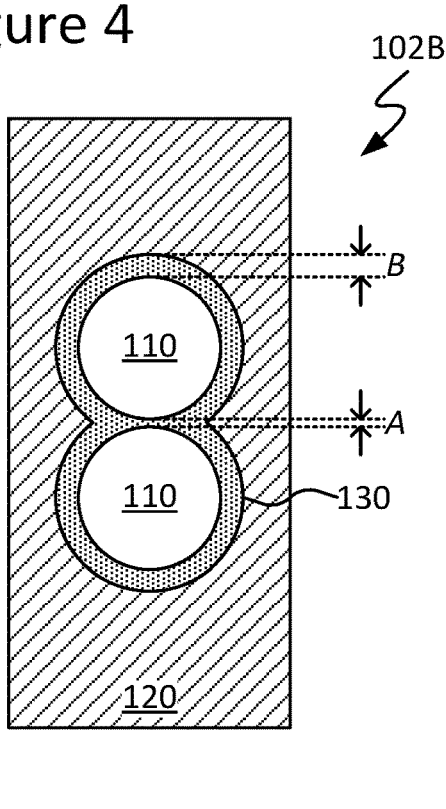
FIG. 4 illustrates a cross-sectional view of a nanowire transistor device configured in accordance with another embodiment of the present disclosure.
Figure 5:
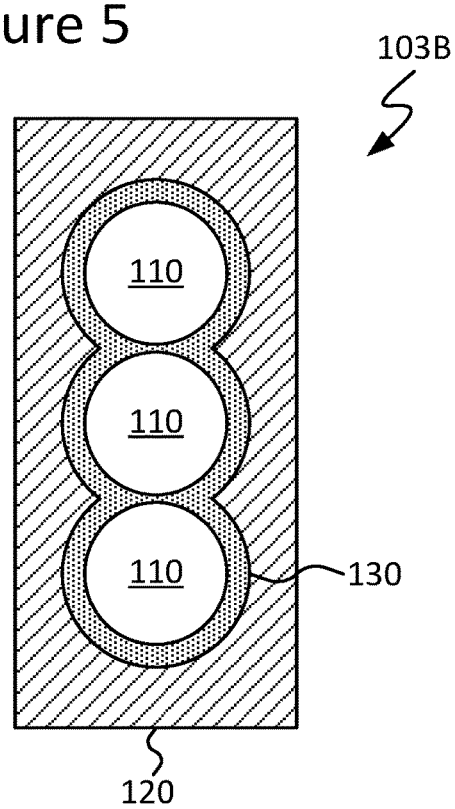
FIG. 5 illustrates a cross-sectional view of a nanowire transistor device configured in accordance with another embodiment of the present disclosure.

FIGS. 2-3 illustrate cross-sectional views of nanowire transistor devices 102A and 103A, respectively, configured in accordance with some embodiments of the present disclosure. As can be seen, transistor devices 102A and 103A include several neighboring nanowires 110 (e.g., two nanowires 110 for transistor device 102A; three nanowires 110 for transistor device 103A). It should be noted that, although the various embodiments illustrated via FIGS. 2-11 include either two or three neighboring nanowires 110, the present disclosure is not so limited, as in a more general sense, and in accordance with some embodiments, the quantity of nanowires 110 can be customized, as desired for a given target application or end-use. For instance, other embodiments may include four, five, six, seven, eight, or more neighboring nanowires 110. Numerous configurations and variations will be apparent in light of this disclosure.

A given nanowire 110 can be formed from any suitable semiconductor material(s), as will be apparent in light of this disclosure. For instance, in some cases, a given nanowire 110 may be formed from silicon (Si), germanium (Ge), silicon germanium (SiGe), silicon germanium carbide (SiGeC), or silicon carbide (SiC). In some cases, a given nanowire 110 may be formed from a III-V compound semiconductor such as gallium nitride (GaN), gallium arsenide (GaAs), indium arsenide (InAs), indium phosphide (InP), or indium gallium arsenide (InGaAs). In a more general sense, and in accordance with some embodiments, a given nanowire 110 may be formed from any one, or combination, of the aforementioned materials.

The dimensions and geometry of a given nanowire 110 can be customized, as desired for a given target application or end-use. In some cases, a given nanowire 110 may have an average width or diameter, for example, in the range of about 1-15 nm (e.g., about 1-5 nm, about 5-10 nm, about 10-15 nm, or any other sub-range in the range of about 1-15 nm). In some other cases, a given nanowire 110 may have an average width or diameter, for example, of about 1 nm or less (e.g., about 0.5 nm or less, about 0.1 nm or less, etc.). In some still other cases, a given nanowire 110 may have an average width or diameter, for example, of about 15 nm or greater (e.g., about 20 nm or greater, about 25 nm or greater, about 30 nm or greater, etc.). In some instances, a given nanowire 110 may be generally cylindrical in shape, having a circular, elliptical, or other curvilinear (e.g., regular or irregular closed curve) cross-sectional profile. In other instances, a given nanowire 110 may be generally prismatic in shape, having a square, rectangular, hexagonal, or other polygonal (e.g., regular or irregular polygon) cross-sectional profile. As will be appreciated in light of this disclosure, in some cases, a given nanowire 110 or a given plurality of nanowires 110 may vary in dimension, geometry, or both as a result, for example, of real-world processing limitations and conditions. Numerous configurations and variations will be apparent in light of this disclosure.

Nanowires 110 may be formed via any suitable technique(s), as will be apparent in light of this disclosure. For instance, in some cases, nanowires 110 may be formed via any one, or combination, of an immersion lithography process, an electron-beam (e-beam) lithography process, and an extreme ultraviolet (EUV) lithography process. Nanowires 110 may be formed, for example, in a regular, semi-regular, or irregular array, as desired for a given target application or end-use. That is, in some instances, nanowires 110 may be formed as a regular array in which all (or nearly all) of the nanowires 110 are arranged in a systematic manner in relation to one another. In other instances, nanowires 110 may be formed as a semi-regular array in which a sub-set of the nanowires 110 are arranged in a systematic manner in relation to one another, but at least one other nanowire 110 is not so arranged. In still other instances, nanowires 110 may be formed as an irregular array in which the nanowires 110 are not arranged in a systematic manner in relation to one another. In some cases, neighboring nanowires 110 may be substantially equidistantly spaced from one another (e.g., may exhibit a substantially constant spacing). In some other cases, however, the spacing of neighboring nanowires 110 may be varied, as desired. In some instances, neighboring nanowires 110 may be physically separated from one another by a distance of about 10 nm or less (e.g., about 8 nm or less, about 5 nm or less, about 3 nm or less, about 1 nm or less, etc.). In some other instances, neighboring nanowires 110 may be disposed sufficiently proximate one another such that they are just in contact with one another (e.g., they are contiguous) but are still discrete. In some other instances, neighboring nanowires 110 may be disposed sufficiently proximate one another such that they merge to provide a single, continuous nanowire 110 body (e.g., in a manner similar in shape to a merging of the neighboring nanowires 110 generally shown via FIGS. 4-5 and 10-11, discussed below, but with one or more portions of semiconductor material bridging or otherwise connecting the neighboring nanowires 110). Other suitable materials, dimensions, geometries, and formation techniques for nanowire(s) 110 will depend on a given application and will be apparent in light of this disclosure.

As can further be seen from FIGS. 2-3, each of transistor devices 102A and 103A includes a gate 120 partially disposed about (e.g., partially surrounding) nanowires 110. Gate 120 can be formed from any suitable electrically conductive material(s), as will be apparent in light of this disclosure. For instance, in some cases, gate 120 may be formed from a metal such as copper (Cu), aluminum (Al), tungsten (W), nickel (Ni), cobalt (Co), silver (Ag), gold (Au), titanium (Ti), or tantalum (Ta). In some cases, gate 120 may be formed from a nitride such as titanium nitride (TiN) or tantalum nitride (TaN). In some cases, gate 120 may be formed from doped or undoped polysilicon (poly-Si). In a more general sense, and in accordance with some embodiments, gate 120 may be formed from any one, or combination, of the aforementioned materials.

The dimensions and geometry of gate 120 can be customized, as desired for a given target application or end-use. Gate 120 may be formed using any suitable technique(s), as will be apparent in light of this disclosure. For instance, in some cases, gate 120 may be formed via any one, or combination, of a physical vapor deposition (PVD) process, a chemical vapor deposition (CVD) process, an electroplating process, and an electroless deposition process. Other suitable materials, dimensions, geometries, and formation techniques for gate 120 will depend on a given application and will be apparent in light of this disclosure.

As can further be seen from FIGS. 2-3, each of transistor devices 102A and 103A includes a dielectric layer 130 disposed between a given nanowire 110 and gate 120. Dielectric layer 130 can be formed from any suitable dielectric material(s), as will be apparent in light of this disclosure. For instance, in some cases, dielectric layer 130 may be formed from an oxide such as silicon dioxide ($SiO_2$), aluminum oxide ($Al_2O_3$), hafnium oxide ($HfO_2$), zirconium dioxide ($ZrO_2$), tantalum pentoxide ($Ta_2O_5$), titanium dioxide ($TiO_2$), lanthanum oxide ($La_2O_3$), yttrium oxide ($Y_2O_3$), hafnium silicate ($HfSiO_4$), zirconium silicate ($ZrSiO_4$), strontium titanate ($SrTiO_3$), barium titanate ($BaTiO_3$), lanthanum aluminate ($LaAlO_3$), barium strontium titanate ($BaSrTiO_3$), lead scandium tantalate ($PbScTaO_3$), or lead zinc niobate ($PbZnNbO_3$). In some cases, dielectric layer 130 may be formed from a carbon (C)-doped oxide. In some cases, dielectric layer 130 may be formed from a nitride such as silicon nitride ($Si_3N_4$) or a carbide such as silicon carbide (SiC). In some cases, dielectric layer 130 may be formed from a polymer (or blend of polymers) such as polyimide, perfluorocyclobutane ($C_4F_8$), or polytetrafluoroethylene (PTFE). In some cases, dielectric layer 130 may be formed from a phosphosilicate glass (PSG), a fluorosilicate glass (FSG), an organosilicate glass (OSG) such as silsesquioxane or siloxane, or a carbosilane material such as methyl- or ethyl-bridged silicates or carbosilane-ringed structures such as 1,3,5-trisilacyclohexane derivatives. In a more general sense, and in accordance with some embodiments, dielectric layer 130 may be formed from any one, or combination, of the aforementioned materials.

The dimensions and geometry of dielectric layer 130 can be customized, as desired for a given target application or end-use. As can be seen from FIG. 2, for instance, a given dielectric layer 130 may have an average thickness B. In some cases, dielectric layer 130 may have an average thickness B, for example, in the range of about 1-10 nm (e.g., about 1-5 nm, about 5-10 nm, or any other sub-range in the range of about 1-10 nm). In some other cases, dielectric layer 130 may have an average thickness B, for example, of about 1 nm or less (e.g., about 0.5 nm or less, about 0.1 nm or less, etc.). In some still other cases, dielectric layer 130 may have an average thickness B, for example, of about 10 nm or greater (e.g., about 15 nm or greater, about 20 nm or greater, etc.).

In some cases, dielectric layer 130 may have a substantially uniform thickness over the topography provided, for example, by any underlying nanowire(s) 110. In some instances, dielectric layer 130 may be provided as a substantially conformal layer over such topography. In other instances, dielectric layer 130 may be provided with a non-uniform or otherwise varying thickness over such topography. For example, in some cases a first portion of dielectric layer 130 may have a thickness within a first range, whereas a second portion thereof may have a thickness within a second, different range. In some instances, a given dielectric layer 130 may have a first portion having an average thickness B and a second portion having an average thickness that is different from average thickness B by about 70% or less, about 50% or less, about 20% or less, about 15% or less, about 10% or less, or about 5% or less.

Dielectric layer 130 can be formed using any suitable technique(s), as will be apparent in light of this disclosure. For instance, in some cases, dielectric layer 130 may be formed via any one, or combination, of a chemical vapor deposition (CVD) process such as plasma-enhanced CVD (PECVD) and an atomic layer deposition (ALD) process. Other suitable materials, dimensions, geometries, and formation techniques for dielectric layer 130 will depend on a given application and will be apparent in light of this disclosure.

In accordance with some embodiments, dielectric layer 130 may be of a single-layer configuration (e.g., as in FIGS. 2-5). In some embodiments, a first dielectric layer 130 associated with a first nanowire 110 may be disposed sufficiently proximate a second dielectric layer 130 associated with a second nanowire 110 such that the first and second dielectric layers 130 are just in contact with one another (e.g., they are contiguous) but are still discrete layers. For instance, consider FIGS. 2-3 (discussed above). As can be seen from FIG. 2, for example, the contacted first and second dielectric layers 130 may have a collective thickness C at a point of contact there between. In some embodiments, collective thickness C may be about equal to twice the average thickness B (e.g., 2×B) of either of the first and second dielectric layers 130. In some other embodiments, collective thickness C may be less than twice the average thickness B (e.g., less than 2×B, within about 70%) of either of the first and second dielectric layers 130. In some other embodiments, collective thickness C may be greater than twice the average thickness B (e.g., greater than 2×B, within about 70%) of either of the first and second dielectric layers 130.

In some other instances, a first dielectric layer 130 associated with a first nanowire 110 may be disposed proximate a second dielectric layer 130 associated with a second nanowire 110 such that a portion of gate 120 remains there between in a region R, as generally shown via FIG. 2, for example. In some cases, the thickness of gate 120 in region R may be, for example, about 5 nm or less (e.g., in the range of about 0-2.5 nm, about 2.5-5 nm, or any other sub-range that is less than or equal to about 5 nm). Numerous configurations and variations will be apparent in light of this disclosure.

In some embodiments, a first dielectric layer 130 associated with a first nanowire 110 may be disposed sufficiently proximate a second dielectric layer 130 associated with a second nanowire 110 such that the first and second dielectric layers 130 merge with one another to provide a single, continuous dielectric layer 130 shared by the first and second nanowires 110. For instance, consider FIGS. 4-5, which illustrate cross-sectional views of transistor devices 102B and 103B, respectively, configured in accordance with some embodiments of the present disclosure. As can be seen from FIG. 4, for example, the merged first and second dielectric layers 130 may have a merged thickness A at a point of merging there between. In some embodiments, merged thickness A may be about equal to the average thickness B of either of the first and second dielectric layers 130. In some other embodiments, merged thickness A may be less than the average thickness B (e.g., within about 70%) of either of the first and second dielectric layers 130. In some other embodiments, merged thickness A may be greater than the average thickness B, but less than twice the average thickness B (e.g., less than 2×B, within about 70%) of either of the first and second dielectric layers 130. As can further be seen, nanowires 110 may be proximate one another but not in contact, being physically separated by a portion of the single, continuous dielectric layer 130 shared by those nanowires 110, in accordance with some embodiments. In some other embodiments, however, nanowires 110 may be in contact with one another (e.g., contiguous) or merged (e.g., continuous), as discussed above.

Figure 6:
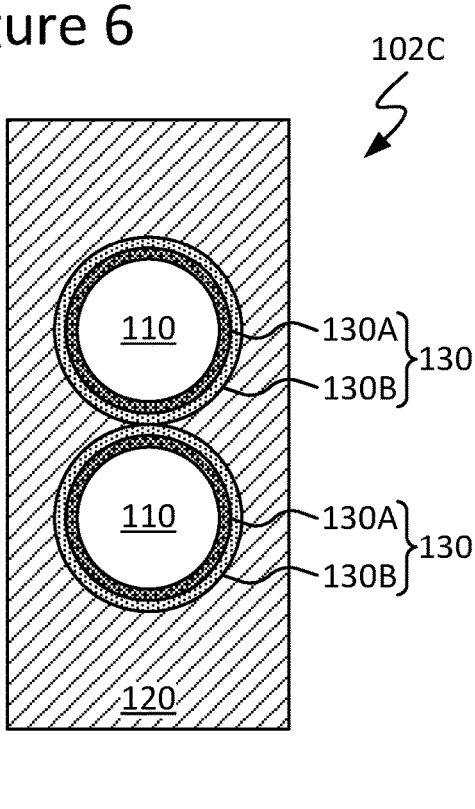
FIG. 6 illustrates a cross-sectional view of a nanowire transistor device configured in accordance with another embodiment of the present disclosure.
Figure 7:
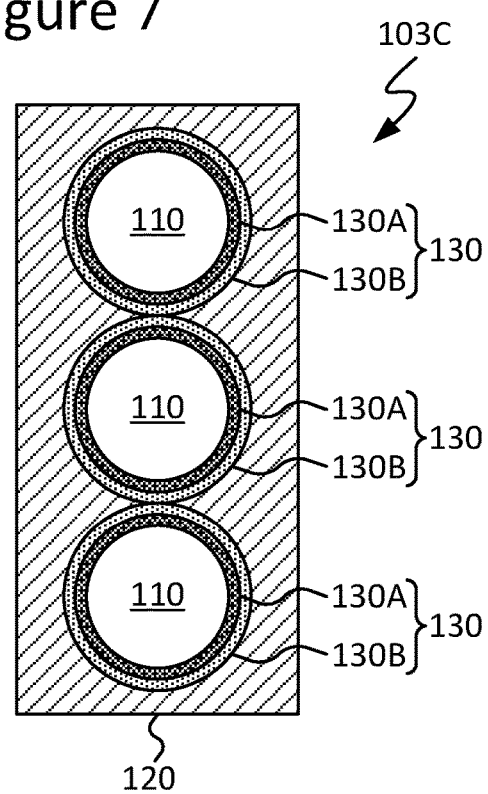
FIG. 7 illustrates a cross-sectional view of a nanowire transistor device configured in accordance with another embodiment of the present disclosure.
Figure 8:
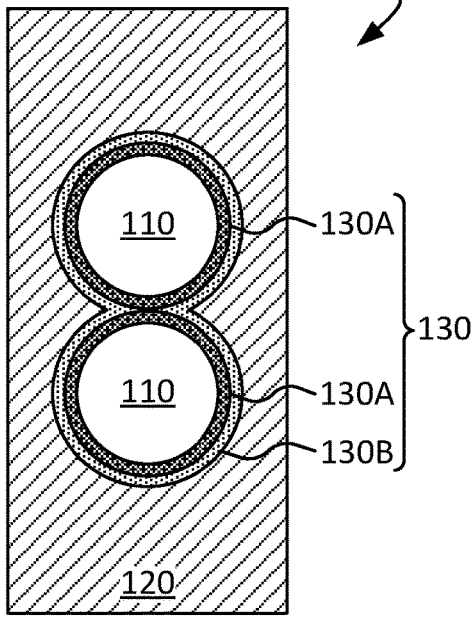
FIG. 8 illustrates a cross-sectional view of a nanowire transistor device configured in accordance with another embodiment of the present disclosure.
Figure 9:
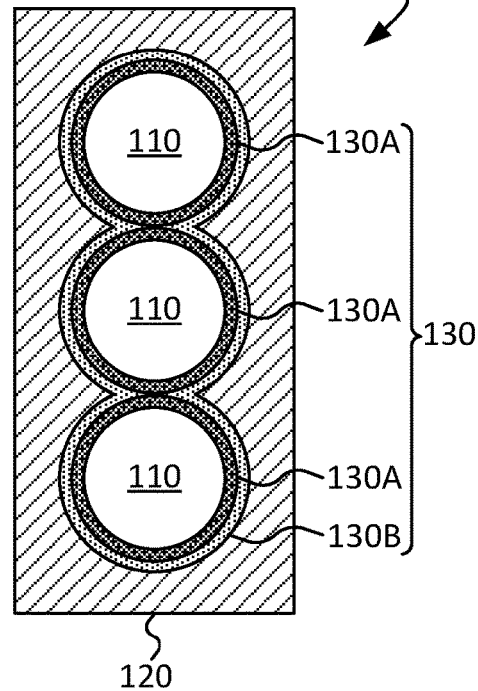
FIG. 9 illustrates a cross-sectional view of a nanowire transistor device configured in accordance with another embodiment of the present disclosure.
Figure 10:
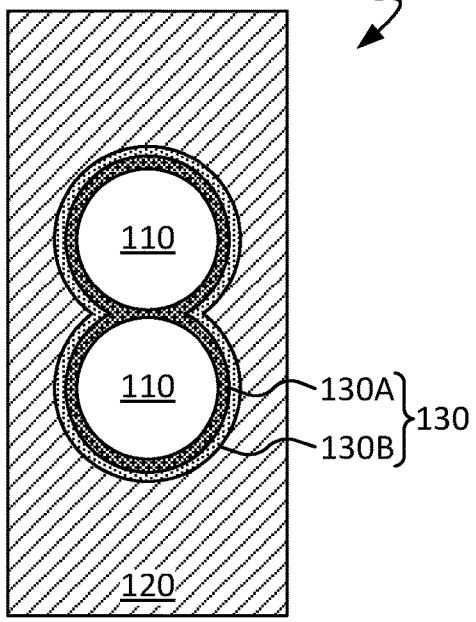
FIG. 10 illustrates a cross-sectional view of a nanowire transistor device configured in accordance with another embodiment of the present disclosure.
Figure 11:
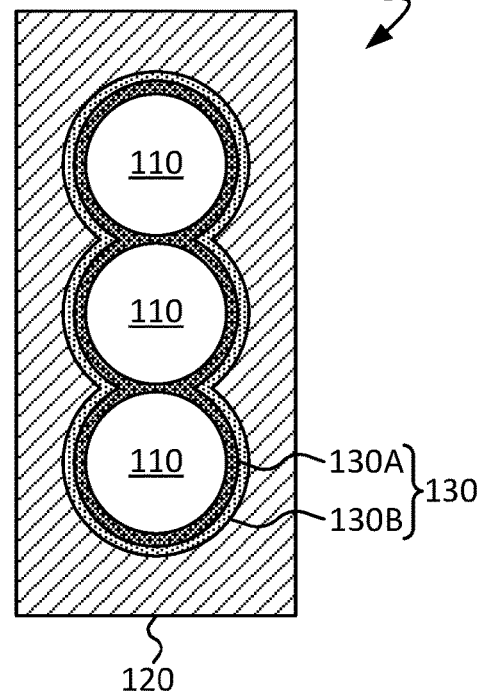
FIG. 11 illustrates a cross-sectional view of a nanowire transistor device configured in accordance with another embodiment of the present disclosure.

In accordance with some embodiments, dielectric layer 130 may be of a multi-layer configuration, having two or more constituent layers (e.g., as in FIGS. 6-11). FIGS. 6-7 illustrate cross-sectional views of transistor devices 102C and 103C, respectively, configured in accordance with some embodiments of the present disclosure. As can be seen here, dielectric layer 130 may include, for example: (1) a first constituent dielectric layer 130A (e.g., an underlayer) disposed around an underlying nanowire 110; and (2) a second constituent dielectric layer 130B (e.g., an overlayer) disposed over the first constituent dielectric layer 130A. It should be noted, however, that the present disclosure is not intended to be limited only to bi-layer configurations for a given dielectric layer 130 of multi-layer configuration, as in a more general sense, and in accordance with other embodiments, a given multi-layer dielectric layer 130 may have any quantity (e.g., three, four, five, or more) of constituent dielectric layers 130A, 130B, etc., as desired for a given target application or end-use.

As will be appreciated in light of this disclosure, a given constituent dielectric layer 130A, 130B, etc., may be formed from any of the example materials and techniques and may be provided with any of the example dimensions and geometries discussed above, for instance, with respect to a dielectric layer 130 of single-layer configuration, in accordance with some embodiments. In some cases, first constituent dielectric layer 130A and second constituent dielectric layer 130B may be of the same material composition, whereas in other cases, they may be of different material composition. In an example case, first constituent dielectric layer 130A may be silicon dioxide ($SiO_2$), and second constituent dielectric layer 130B may be a high-κ dielectric material (e.g., a dielectric material having a dielectric constant κ greater than or equal to that of silicon dioxide). In some cases, a given constituent dielectric layer 130A, 130B, etc., may have an average thickness, for example, in the range of about 1-10 nm (e.g., about 1-5 nm, about 5-10 nm, or any other sub-range in the range of about 1-10 nm). In some cases, a given constituent dielectric layer 130A, 130B, etc., may have an average thickness, for example, in the range of about 0.1-5 nm (e.g., about 0.1-2.5 nm, about 2.5-5 nm, or any other sub-range in the range of about 0.1-5 nm). In some cases, a given constituent dielectric layer 130A, 130B, etc., may have an average thickness, for example, of about 1 nm or less (e.g., about 0.5 nm or less, about 0.1 nm or less, etc.). In some cases, a given constituent dielectric layer 130A, 130B, etc., may have an average thickness, for example, of about 10 nm or greater (e.g., about 15 nm or greater, about 20 nm or greater, etc.). In some instances, a first constituent dielectric layer 130A and a second constituent dielectric layer 130B may have substantially the same average thickness, whereas in other instances, they may have different average thicknesses. In some cases, a given constituent dielectric layer 130A, 130B, etc., may have a substantially uniform thickness over an underlying topography. In some instances, a given constituent dielectric layer 130A, 130B, etc., may be provided as a substantially conformal layer over such topography. In other instances, a given constituent dielectric layer 130A, 130B, etc., may be provided with a non-uniform or otherwise varying thickness over such topography. For example, in some cases, a first portion of a given constituent dielectric layer 130A, 130B, etc., may have a thickness within a first range, whereas a second portion thereof may have a thickness within a second, different range.

In some embodiments, a first dielectric layer 130 associated with a first nanowire 110 may be disposed sufficiently proximate a second dielectric layer 130 associated with a second nanowire 110 such that: (1) the second constituent dielectric layers 130B (e.g., overlayers) are just in contact with one another (e.g., the second constituent dielectric layers 130B are contiguous) but are still discrete layers; and (2) the first constituent dielectric layers 130A (e.g., underlayers) are separate from one another. For instance, consider FIGS. 6-7.

In some embodiments, a first dielectric layer 130 associated with a first nanowire 110 may be disposed sufficiently proximate a second dielectric layer 130 associated with a second nanowire 110 such that: (1) the second constituent dielectric layers 130B (e.g., overlayers) merge with one another to provide a single, continuous second constituent dielectric layer 130B shared by those nanowires 110; and (2) the first constituent dielectric layers 130A (e.g., underlayers) are just in contact with one another (e.g., the first constituent dielectric layers 130A are contiguous) but are still discrete layers. For instance, consider FIGS. 8-9, which illustrate cross-sectional views of transistor devices 102D and 103D, respectively, configured in accordance with some embodiments of the present disclosure. In some other embodiments, a first dielectric layer 130 associated with a first nanowire 110 may be disposed sufficiently proximate a second dielectric layer 130 associated with a second nanowire 110 such that: (1) the second constituent dielectric layers 130B (e.g., overlayers) merge with one another to provide a single, continuous second constituent dielectric layer 130B shared by those nanowires 110; and (2) the first constituent dielectric layers 130A (e.g., underlayers) are proximate one another but not in contact, being separated by a portion of the single, continuous second constituent dielectric layer 130B shared by those nanowires 110.

In some embodiments, a first dielectric layer 130 associated with a first nanowire 110 may be disposed sufficiently proximate a second dielectric layer 130 associated with a second nanowire 110 such that: (1) the second constituent dielectric layers 130B (e.g., overlayers) merge with one another to provide a single, continuous second constituent dielectric layer 130B shared by those nanowires 110; and (2) the first constituent dielectric layers 130A (e.g., underlayers) merge with one another to provide a single, continuous first constituent dielectric layer 130A shared by those nanowires 110. For instance, consider FIGS. 10-11, which illustrate cross-sectional views of transistor devices 102E and 103E, respectively, configured in accordance with some embodiments of the present disclosure. As discussed above, neighboring nanowires 110 may be, in accordance with some embodiments, physically separated from one another, just in contact with one another, or merged with one another to a given degree, as desired for a given target application or end-use.

As will be appreciated in light of this disclosure, the disclosed techniques can be used to provide a wide range of transistor devices including any of a wide range of combinations and permutations of dielectric layers 130 (e.g., single-layer and/or multi-layer). Mixing and matching of dielectric layers 130 of single-layer configurations and multi-layer configurations (e.g., having any quantity of constituent layers 130A, 130B, etc.) may be provided, with any desired combinations and permutations of continuity (e.g., merging) and contiguity (e.g., contact) there between, in accordance with some embodiments.

Returning to FIG. 1, the example nanowire transistor architecture depicted therein has a total device height of $H_1$ defined by the neighboring nanowires and their respective gate dielectric layers. As previously noted, the disclosed techniques can be used, for example, to reduce the total device height of a nanowire transistor architecture, in accordance with some embodiments. For instance, consider the transistor device 102A illustrated in FIG. 2. There, neighboring nanowires 110 and their respective dielectric layers 130 are formed proximate one another as described herein, providing a condensed footprint that results in a total device height $H_2$ that is less than the total device height $H_1$ of the example nanowire transistor architecture of FIG. 1. In some instances, the disclosed techniques can be used, for example, to provide a nanowire transistor architecture (or other IC) having a total device height $H_2$ less than or equal to about 30 nm (e.g., about 25 nm or less, about 20 nm or less, about 15 nm or less, about 10 nm or less, etc.). As will be appreciated in light of this disclosure, reducing the total device height may realize any one, or combination, of lower switching power, lower dynamic capacitance, and shorter switching time delay of the host transistor architecture (or other host IC).

As previously noted, the disclosed techniques can be used, for example, to increase the total active device width of a nanowire transistor architecture, in accordance with some embodiments. For instance, consider the example embodiment illustrated in FIG. 3. There, neighboring nanowires 110 and their respective dielectric layers 130 are formed proximate one another as described herein, providing a footprint that results in a total device height $H_3$ that is about equal to the total device height $H_1$ of the example nanowire transistor architecture of FIG. 1 (e.g., $H_3 \cong H_1$). Although about the same total device height is provided, greater active device width exists for transistor device 103A in FIG. 3 than for the example nanowire transistor architecture of FIG. 1 (e.g., transistor device 103A fits three nanowires 110 into about the same space as the example nanowire transistor architecture of FIG. 1, which has only two nanowires). As will be appreciated in light of this disclosure, increasing the active device width by increasing the density of nanowires 110 in a given device height may realize any one, or combination, of increased performance per watt and faster switching delay for a given dynamic capacitance or power consumption.

Example Implementation Data

Consider the following example case. A nanowire transistor device is configured, in accordance with an embodiment of the present disclosure, with six nanowires 110, each including a dielectric layer 130 of single-layer configuration, as generally shown via FIG. 3. When compared at matched power consumption with a nanowire transistor architecture configured as in FIG. 1 with four nanowires, each nanowire separated from the next by a distance of 10 nm, the nanowire transistor device configured in accordance with an embodiment of the present disclosure exhibited about a 10-15% (e.g., ±2.5%) faster switching delay time than the FIG. 1 nanowire transistor architecture.

Example System

Figure 12:
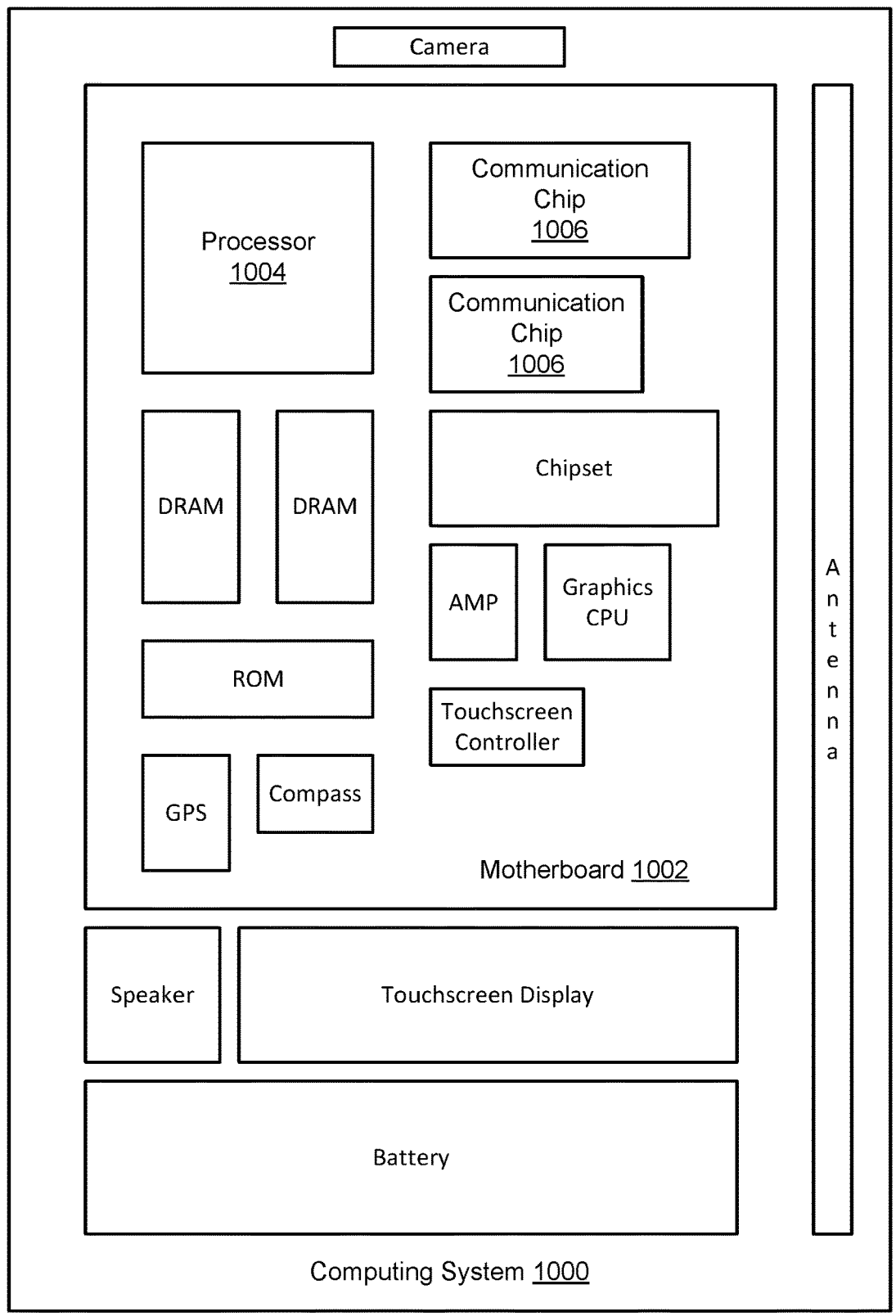
FIG. 12 illustrates a computing system implemented with integrated circuit structures or devices formed using the disclosed techniques in accordance with an example embodiment.

FIG. 12 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multistandard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: first and second semiconductor nanowires; a gate partially surrounding the first and second semiconductor nanowires; a first dielectric layer disposed between the gate and the first semiconductor nanowire; and a second dielectric layer disposed between the gate and the second semiconductor nanowire; wherein the first and second dielectric layers are proximate one another such that about 5 nm or less of the gate is present between the first and second semiconductor nanowires.

Example 2 includes the subject matter of any of Examples 1 and 3-24, wherein the first and second dielectric layers are in contact with one another such that the gate is not present between the first and second semiconductor nanowires.

Example 3 includes the subject matter of any of Examples 1-2 and 6-24, wherein the first and second dielectric layers are in contact with one another but are still discrete layers, such that at a point of contact there between, the first and second dielectric layers collectively have an average thickness greater than an average thickness of either the first or second dielectric layer alone at a point without such contact.

Example 4 includes the subject matter of any of Examples 1-2 and 6-24, wherein the first and second dielectric layers are merged with one another, providing a single, continuous dielectric layer shared by the first and second semiconductor nanowires, such that at a point of merging there between, the first and second dielectric layers collectively have an average thickness less than twice an average thickness of either the first or second dielectric layer alone at a point without such merging.

Example 5 includes the subject matter of any of Examples 1-2 and 6-24, wherein the first and second dielectric layers are merged with one another, providing a single, continuous dielectric layer shared by the first and second semiconductor nanowires, such that at a point of merging there between, the first and second dielectric layers collectively have an average thickness less than or about equal to an average thickness of either the first or second dielectric layer alone at a point without such merging.

Example 6 includes the subject matter of any of Examples 1-5 and 7-24, wherein at least one of: the first dielectric layer is of a multi-layer configuration including: a first underlayer disposed over the first nanowire; and a first overlayer disposed over the first underlayer; and the second dielectric layer is of a multi-layer configuration including: a second underlayer disposed over the second nanowire; and a second overlayer disposed over the second underlayer.

Example 7 includes the subject matter of Example 6, wherein: both the first and second dielectric layers are of multi-layer configuration; and the first and second overlayers are in contact with one another but are still discrete layers.

Example 8 includes the subject matter of Example 6, wherein: both the first and second dielectric layers are of multi-layer configuration; and the first and second overlayers are merged with one another, providing a single, continuous overlayer shared by the first and second semi conductor nanowires.

Example 9 includes the subject matter of Example 8, wherein the first and second underlayers are in contact with one another but are still discrete layers.

Example 10 includes the subject matter of Example 8, wherein the first and second underlayers are merged with one another, providing a single, continuous underlayer shared by the first and second semiconductor nanowires.

Example 11 includes the subject matter of Example 6, wherein: either the first or second dielectric layer is of multi-layer configuration; and the other of the first or second dielectric layer is of single-layer configuration and is in contact with the first or second overlayer of the first or second dielectric layer of multi-layer configuration but the first or second overlayer and the other of the first or second dielectric layer of single-layer configuration are still discrete layers.

Example 12 includes the subject matter of Example 6, wherein: either the first or second dielectric layer is of multi-layer configuration; and the other of the first or second dielectric layer is of single-layer configuration and is merged with the first or second overlayer of the first or second dielectric layer of multi-layer configuration, providing a single, continuous dielectric layer shared by the first and second semiconductor nanowires.

Example 13 includes the subject matter of Example 6, wherein at least one of: the first underlayer and the first overlayer are of the same material composition; and the second underlayer and the second overlayer are of the same material composition.

Example 14 includes the subject matter of Example 6, wherein at least one of: the first underlayer and the first overlayer are of different material composition; and the second underlayer and the second overlayer are of different material composition.

Example 15 includes the subject matter of Example 6, wherein: at least one of the first and second underlayers includes silicon dioxide; and at least one of the first and second overlayers includes a dielectric material having a dielectric constant κ greater than or equal to that of silicon dioxide.

Example 16 includes the subject matter of Example 6, wherein at least one of: the first underlayer and the first overlayer are of the same average thickness; and the second underlayer and the second overlayer are of the same average thickness.

Example 17 includes the subject matter of Example 6, wherein at least one of: the first underlayer and the first overlayer are of different average thicknesses; and the second underlayer and the second overlayer are of different average thicknesses.

Example 18 includes the subject matter of Example 6, wherein at least one of the first and second underlayers has an average thickness in the range of about 0.1-5 nm.

Example 19 includes the subject matter of Example 6, wherein at least one of the first and second overlayers has an average thickness in the range of about 0.1-5 nm.

Example 20 includes the subject matter of any of Examples 1-19 and 21-24, wherein at least one of the first and second dielectric layers has an average thickness in the range of about 1-10 nm.

Example 21 includes the subject matter of any of Examples 1-20 and 22-24, wherein the first and second semiconductor nanowires are separated by a distance of about 5 nm or less.

Example 22 includes the subject matter of any of Examples 1-21 and 23-24, wherein at least one of the first and second semiconductor nanowires has an average width or diameter in the range of about 1-15 nm.

Example 23 includes the subject matter of any of Examples 1-22 and 24, wherein at least one of the first and second semiconductor nanowires has a curvilinear cross-sectional profile.

Example 24 includes the subject matter of any of Examples 1-23, wherein at least one of the first and second semiconductor nanowires has a polygonal cross-sectional profile.

Example 25 is a method of forming an integrated circuit, the method including: providing first and second semiconductor nanowires; providing a gate partially surrounding the first and second semiconductor nanowires; providing a first dielectric layer disposed between the gate and the first semiconductor nanowire; and providing a second dielectric layer disposed between the gate and the second semiconductor nanowire, wherein the first and second dielectric layers are proximate one another such that about 5 nm or less of the gate is present between the first and second semiconductor nanowires.

Example 26 includes the subject matter of any of Examples 25 and 27-48, wherein the first and second dielectric layers are in contact with one another such that the gate is not present between the first and second semiconductor nanowires.

Example 27 includes the subject matter of any of Examples 25-26 and 30-48, wherein the first and second dielectric layers are in contact with one another but are still discrete layers, such that an overall thickness of the first and second dielectric layers at a point where they contact one another is greater than an average thickness of a single one of the first and second dielectric layers at a point without such contact.

Example 28 includes the subject matter of any of Examples 25-26 and 30-48, wherein the first and second dielectric layers are merged with one another, providing a single, continuous dielectric layer shared by the first and second semiconductor nanowires, such that an overall thickness of the first and second dielectric layers at a point where they merge with one another is less than twice an average thickness of a single one of the first and second dielectric layers at a point without such merging.

Example 29 includes the subject matter of any of Examples 25-26 and 30-48, wherein the first and second dielectric layers are merged with one another, providing a single, continuous dielectric layer shared by the first and second semiconductor nanowires, such that an overall thickness of the first and second dielectric layers at a point where they merge with one another is less than or about equal to an average thickness of a single one of the first and second dielectric layers at a point without such merging.

Example 30 includes the subject matter of any of Examples 25-29 and 31-48, wherein at least one of: the first dielectric layer is of a multi-layer configuration including: a first underlayer disposed over the first nanowire; and a first overlayer disposed over the first underlayer; and the second dielectric layer is of a multi-layer configuration including: a second underlayer disposed over the second nanowire; and a second overlayer disposed over the second underlayer.

Example 31 includes the subject matter of Example 30, wherein: both the first and second dielectric layers are of multi-layer configuration; and the first and second overlayers are in contact with one another but are still discrete layers.

Example 32 includes the subject matter of Example 30, wherein: both the first and second dielectric layers are of multi-layer configuration; and the first and second overlayers are merged with one another, providing a single, continuous overlayer shared by the first and second semi conductor nanowires.

Example 33 includes the subject matter of Example 32, wherein the first and second underlayers are in contact with one another but are still discrete layers.

Example 34 includes the subject matter of Example 32, wherein the first and second underlayers are merged with one another, providing a single, continuous underlayer shared by the first and second semiconductor nanowires.

Example 35 includes the subject matter of Example 30, wherein: either the first or second dielectric layer is of multi-layer configuration; and the other of the first or second dielectric layer is of single-layer configuration and is in contact with the first or second overlayer of the first or second dielectric layer of multi-layer configuration but the first or second overlayer and the other of the first or second dielectric layer of single-layer configuration are still discrete layers.

Example 36 includes the subject matter of Example 30, wherein: either the first or second dielectric layer is of multi-layer configuration; and the other of the first or second dielectric layer is of single-layer configuration and is merged with the first or second overlayer of the first or second dielectric layer of multi-layer configuration, providing a single, continuous dielectric layer shared by the first and second semiconductor nanowires.

Example 37 includes the subject matter of Example 30, wherein at least one of: the first underlayer and the first overlayer are of the same material composition; and the second underlayer and the second overlayer are of the same material composition.

Example 38 includes the subject matter of Example 30, wherein at least one of: the first underlayer and the first overlayer are of different material composition; and the second underlayer and the second overlayer are of different material composition.

Example 39 includes the subject matter of Example 30, wherein: at least one of the first and second underlayers includes silicon dioxide; and at least one of the first and second overlayers includes a dielectric material having a dielectric constant κ greater than or equal to that of silicon dioxide.

Example 40 includes the subject matter of Example 30, wherein at least one of: the first underlayer and the first overlayer are of the same average thickness; and the second underlayer and the second overlayer are of the same average thickness.

Example 41 includes the subject matter of Example 30, wherein at least one of: the first underlayer and the first overlayer are of different average thicknesses; and the second underlayer and the second overlayer are of different average thicknesses.

Example 42 includes the subject matter of Example 30, wherein at least one of the first and second underlayers has an average thickness in the range of about 0.1-5 nm.

Example 43 includes the subject matter of Example 30, wherein at least one of the first and second overlayers has an average thickness in the range of about 0.1-5 nm.

Example 44 includes the subject matter of any of Examples 25-43 and 45-48, wherein at least one of the first and second dielectric layers has an average thickness in the range of about 1-10 nm.

Example 45 includes the subject matter of any of Examples 25-44 and 46-48, wherein the first and second semiconductor nanowires are separated by a distance of about 5 nm or less.

Example 46 includes the subject matter of any of Examples 25-45 and 47-48, wherein at least one of the first and second semiconductor nanowires has an average width or diameter in the range of about 1-15 nm.

Example 47 includes the subject matter of any of Examples 25-46 and 48, wherein at least one of the first and second semiconductor nanowires has a curvilinear cross-sectional profile.

Example 48 includes the subject matter of any of Examples 25-47, wherein at least one of the first and second semiconductor nanowires has a polygonal cross-sectional profile.

Example 49 is a nanowire transistor device including: a plurality of semiconductor nanowires; a gate partially surrounding the plurality of semiconductor nanowires; and a dielectric layer at least partially surrounding at least one of the semiconductor nanowires and configured such that about 5 nm or less of the gate is present between neighboring semiconductor nanowires.

Example 50 includes the subject matter of any of Examples 49 and 51-61, wherein the dielectric layer is configured such that the gate is not present between neighboring semi conductor nanowires.

Example 51 includes the subject matter of any of Examples 49-50 and 52-61, wherein the dielectric layer includes: a first portion fully surrounding a first semiconductor nanowire of the plurality; and a second portion fully surrounding a second semiconductor nanowire of the plurality.

Example 52 includes the subject matter of Example 51, wherein the first and second portions are in contact with one another but are still discrete layers.

Example 53 includes the subject matter of Example 51, wherein the first and second portions are merged with one another, providing a single, continuous dielectric layer shared by the first and second semiconductor nanowires.

Example 54 includes the subject matter of Example 51, wherein each of the first and second portions is of a multi-layer configuration including: an underlayer disposed over the underlying first or second semiconductor nanowire; and an overlayer disposed over the underlayer.

Example 55 includes the subject matter of Example 54, wherein the overlayers of the first and second portions are in contact with one another but are still discrete layers.

Example 56 includes the subject matter of Example 54, wherein the overlayers of the first and second portions are merged with one another, providing a single, continuous overlayer shared by the first and second semiconductor nanowires.

Example 57 includes the subject matter of Example 54, wherein the underlayers of the first and second portions are in contact with one another but are still discrete layers.

Example 58 includes the subject matter of Example 54, wherein the underlayers of the first and second portions are merged with one another, providing a single, continuous underlayer shared by the first and second semiconductor nanowires.

Example 59 includes the subject matter of any of Examples 49-58, wherein the nanowire transistor device has a device height of about 30 nm or less.

Example 60 includes the subject matter of any of Examples 49-58, wherein the nanowire transistor device has a device height of about 20 nm or less.

Example 61 includes the subject matter of any of Examples 49-58, wherein the nanowire transistor device has a device height of about 10 nm or less.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

The invention claimed is:

1. An integrated circuit comprising:
   first and second nanowires comprising semiconductor material;
   a gate only partially surrounding each of the first and second nanowires;
   a first dielectric structure between the gate and the first nanowire, the first dielectric structure including one or more layers, each of the one or more layers of the first dielectric structure completely surrounding the first nanowire; and
   a second dielectric structure between the gate and the second nanowire, the second dielectric structure including one or more layers, each of the one or more layers of the second dielectric structure completely surrounding the second nanowire;
   wherein the first and second dielectric structures are in contact with one another, wherein the first and second dielectric structures collectively at a point of contact have an average thickness that is within 70% of twice an average thickness of either the first or second dielectric structure alone at a point without such contact, and wherein an outermost layer of the first dielectric structure is in contact with an outermost layer of the second dielectric structure.

2. The integrated circuit of claim 1, wherein at least one of the first dielectric structure and the second dielectric structure has a single-layer configuration.

3. The integrated circuit of claim 1, wherein at least one of:
   the first dielectric structure has a multi-layer configuration that includes a first underlayer over the first nanowire, and a first overlayer over the first underlayer; and/or
   the second dielectric structure has a multi-layer configuration that includes a second underlayer over the second nanowire, and a second overlayer over the second underlayer.

4. The integrated circuit of claim 3, wherein:
   each of the first and second dielectric structures has a multi-layer configuration;
   the first overlayer is the outermost layer of the first dielectric structure, and the second overlayer is the outermost layer of the second dielectric structure; and
   the first and second overlayers are in contact with one another but are still discrete layers.

5. The integrated circuit of claim 3, wherein:
   the first dielectric structure has a multi-layer configuration;
   the second dielectric structure has a single-layer configuration;
   the overlayer of the first dielectric structure is the outermost layer of the first dielectric structure, and the single layer of the second dielectric structure is the outermost layer of the second dielectric structure; and
   the outermost layer of the first dielectric structure and the outermost layer of the second dielectric structure are in contact with one another but are still discrete layers.

6. The integrated circuit of claim 3, wherein the first overlayer and the second overlayer comprise high-k dielectric material.

7. The integrated circuit of claim 3, wherein:
   at least one of the first and second underlayers has an average thickness in the range of about 0.1-5 nm; and
   at least one of the first and second overlayers has an average thickness in the range of about 0.1-5 nm.

8. The integrated circuit of claim 1, wherein the outermost layer of at least one of the first and second dielectric structure comprises a high-k dielectric material.

9. The integrated circuit of claim 1, wherein at least one of the first and second nanowires has:
   an average width or diameter in the range of about 1-15 nm; and
   a curvilinear cross-sectional profile.

10. The integrated circuit of claim 1, wherein at least one of the first and second nanowires has:
    an average width or diameter in the range of about 1-15 nm; and
    a polygonal cross-sectional profile.

11. An integrated circuit structure including a nanowire transistor device, the integrated circuit structure comprising:
    first and second semiconductor nanowires, each of the first and second semiconductors having a curvilinear cross-section;
    a gate comprising a metal, the gate at least partially surrounding each of the first and second semiconductor nanowires; and
    a first dielectric structure surrounding the first semiconductor nanowire, such that the first dielectric structure is at least partially between the first nanowire and the gate; and
    a second dielectric structure surrounding the second semiconductor nanowire, such that the second dielectric structure is at least partially between the second nanowire and the gate;
    wherein the first and second dielectric structures are configured such that they are merged with one another, providing a single, continuous dielectric layer shared by the first and second semiconductor nanowires, such that at a point of merging, the first and second dielectric structures collectively have an average thickness of less than twice an average thickness of either the first or second dielectric layer alone at a point without such merging.

12. The integrated circuit of claim 11, wherein at the point of merging, the first and second dielectric structures collectively have an average thickness less than or about equal to an average thickness of either the first or second dielectric structure alone at a point without such merging.

13. The integrated circuit structure of claim 11, wherein the gate only partially surrounds each the first and second semiconductor nanowires, and the single, continuous dielectric layer includes high-k dielectric material and completely surrounds each of the first and second semiconductor nanowires.

14. The integrated circuit structure of claim 11, wherein the first and second dielectric structures are bi-layer structures, each bi-layer structure including an underlayer over the corresponding nanowire, and an overlayer over the underlayer, the overlayer distinct from the underlayer, and the overlayer completely surrounds each of the first and second semiconductor nanowires.

15. The integrated circuit structure of claim 14, wherein the underlayer comprises silicon and oxygen, and the overlayer comprises a high-k dielectric material having a dielectric constant greater than that of silicon dioxide.

16. An integrated circuit comprising:
first and second nanowires;
a gate only partially surrounding each of the first and second nanowires;
a first dielectric layer and a second dielectric layer between the gate and the first nanowire, such that the first dielectric layer surrounds the first nanowire, and the second dielectric layer surrounds the first dielectric layer; and
a third dielectric layer and a fourth dielectric layer between the gate and the second nanowire, such that the third dielectric layer surrounds the second nanowire, and the fourth dielectric layer surrounds the third dielectric layer;
wherein the second dielectric layer is in direct contact with the fourth dielectric layer, and the first dielectric layer is not in direct contact with the third dielectric layer.

17. The integrated circuit structure of claim 16, wherein at least one of the first and third dielectric layers comprises silicon and oxygen, and at least one of the second and fourth dielectric layers comprises a high-k dielectric material having a dielectric constant greater than that of silicon dioxide.

18. The integrated circuit structure of claim 16, wherein the second and fourth dielectric layers comprise a high-k dielectric material.

19. The integrated circuit structure of claim 16, wherein the second and fourth dielectric layers comprise hafnium.

20. The integrated circuit structure of claim 16, wherein the second and fourth dielectric layers are in direct contact with one another, but are still discrete layers.

* * * * *